United States Patent [19]

McGinniss et al.

[11] Patent Number: 4,877,988

[45] Date of Patent: Oct. 31, 1989

[54] PIEZOELECTRIC AND PYROELECTRIC POLYMERS

[75] Inventors: Vincent D. McGinniss, Delaware; Joseph R. Preston, Radnor, both of Ohio

[73] Assignee: Battelle Memorial Institute, Columbus, Ohio

[21] Appl. No.: 736,982

[22] Filed: May 22, 1985

Related U.S. Application Data

[63] Continuation of Ser. No. 353,747, Mar. 1, 1982, abandoned.

[51] Int. Cl.$^4$ .................. H01L 41/18; H02N 7/00
[52] U.S. Cl. .................................. 310/306; 310/311; 310/800; 310/357
[58] Field of Search ............... 310/306, 311, 800, 357

[56] References Cited

U.S. PATENT DOCUMENTS

| | | |
|---|---|---|
| 2,436,144 | 2/1948 | Howk . |
| 2,838,715 | 6/1958 | Payne . |
| 3,749,977 | 7/1973 | Sliker . |
| 3,832,580 | 8/1974 | Yamamuro . |
| 3,912,830 | 10/1975 | Murayama . |
| 4,204,135 | 5/1980 | Murayama ........................ 310/357 |

OTHER PUBLICATIONS

"Plastic Electrets are Nearing Industrial Application", Dickinson, pp. 101–102, 8/1948.
Phillips, *An Introduction to Crystallography*, 4th Ed., 1977, pp. 167–168, Longman Group, Ltd.
T. P. Conlon, Jr., "Piezoelectric Nitrile Copolymer", Sandia Laboratories Report SAND 760222, May, 1975.
N. Murayama et al., "The Strong Piezoelectricity in Polyvinylidene Fluoride (PVDF)", ULTRASONICS, Jan., 1976, pp. 15–23.
V. D. McGinniss et al., "Prediction of Solvent and Polymer Characteristics Through the Use of Easy to Measure Properties", Organic Coatings and Polymer Chemistry, vol. 39, pp. 529–534, Sep., 1978.

*Primary Examiner*—Mark. O. Budd
*Attorney, Agent, or Firm*—Klaus H. Wiesmann; Kenneth R. Warburton

[57] ABSTRACT

Disclosed are new piezoelectric/pyroelectric materials of polarized homopolymer and copolymers of trifluorovinyl acetate. Also disclosed is a unique predictive relationship for determining the piezoelectricity of unknown material.

11 Claims, No Drawings

PIEZOELECTRIC AND PYROELECTRIC POLYMERS

BACKGROUND OF THE INVENTION

The present invention relates to pyroelectric and piezoelectric materials and more particularly to such materials derived from synthetic organic polymers.

Traditional ceramic or inorganic piezoelectric materials include quartz, Rochell's salt, barium titanate, and the like. Such ceramic materials are a great improvement over the original carnuba wax/rosin electret formation of Eguchi. Thus, initial commercial piezoelectric materials have been limited to piezoelectric ceramics. Recent advances in synthetic organic polymers, though, have resulted in the development of materials which have some practicality in commercial use. Polymers or plastics can be formulated in very thin films having larger surface area and relatively easy to work with on an industrial scale. Accordingly, considerable research has been devoted to investigating various polymers relative to their piezoelectric and pyroelectric behavior especially of electro-acoustical transducers. Typical studies concentrate on the ability of such organic polymers to form thermoelectrets (i.e. an electret roughly is an electrical equivalent of a permanent magnet). The semi-permanent polarization of polymers to create electrets typically is conducted by cooling the material under an applied voltage or electric field. Apparently, the orientation of the substituents on the polymer backbone during cooling of the polymer from a temperature greater than the glass transition temperature ($T_g$), and especially of substituents with large dipole moments, creates a crystalline-effect or orientation such that a net piezoelectricity is observed. Polymers intensely investigated have included polyvinyl chloride (PVC), polyvinyl fluoride (PVF), polyvinylidene fluoride (PVDF), nylon, polymethyl methacrylate and other acrylics, and the like. Theoretical explanations correlating the piezoelectric behavior of such polymers have considered alternating dipoles, dielectric relaxation, crystallinity, polymer orientation, dipole moment, bond rotation, side chain orientation, mechanical distortion of oriented dipoles, and similar considerations. None of these correlations, however, satisfactorily explains the results researchers have reached to date, much less provides a unifying theory between ceramic and organic piezoelectricity. Further information on piezoelectric polymer development can be found in the reports by Murayama et al., "The Strong Piezoelectricity in Polyvinylidene Fluoride (PVDF)," *Ultrasonics,* pp. 15–23 (January, 1976) and by Conlon, "Piezoelectric Nitrile Copolymer," Sandia Laboratories Report SAND 760222, Sandia Laboratories, Albuquerque, N.M. (May, 1975).

The present invention provides new piezoelectric polymeric materials which display piezoelectricity comparable to prior reported polymeric materials and which displayed unusually good pyroelectricity also. Additionally, a remarkable unifying theory between ceramic and organic piezoelectric materials has been developed.

BOARD STATEMENT OF THE INVENTION

Disclosed are new piezoelectric and pyroelectric materials comprising polarized polytrifluorovinyl acetate and polarized copolymers of trifluorovinyl acetate. The copolymers can be made from trifluorovinyl acetate and an ethylenically unsaturated compound such as a vinyl compound or an $\alpha$-,$\beta$-ethylenically unsaturated carbonyl compound such as an acrylic or acrylamide. A further aspect of the invention is a piezoelectric or pyroelectric element in which the disclosed new piezoelectric materials are interposed between two electrodes. Desirably, such elements are in the form of a thin film of the polarized material with an electrode disposed on each surface of said film.

A further aspect of the invention is a method for interconverting electrical energy and mechanical (eg. acoustical) energy through an electro-mechanical transducer which comprises interconverting said energy through an electromechanical transducer which comprises a piezoelectrically responsive polarized copolymer or homopolymer of trifluorovinyl acetate in thin film form having electrodes disposed on each surface of said film. Yet another aspect of the invention is a method for converting thermal energy into electrical energy through a pyroelectric transducer which comprises converting said energies through a pyroelectric element comprising a polarized copolymer or homopolymer of trifluorovinyl acetate interposed between two electrodes. A yet further embodiment of the invention is an electroluminescent device of luminescent phosphors embedded in a dielectric medium between a pair of electrodes. This improvement comprises said dielectric medium comprising a homopolymer or copolymer of trifluorovinyl acetate.

A still further aspect of the present invention is a method for making a piezoelectric element from a candidate material of unknown piezoelectric response. This method comprises selecting a candidate material from a group thereof based upon their $d_{31}$ coefficients wherein the $d_{31}$ coefficient is determined by a unique predictive relationship to be described in greater detail below and polarizing the selected candidate material under piezoelectric polarizing conditions to make said piezoelectric element.

Advantages of the present invention include the discovery of new piezoelectric and pyroelectric organic materials which are specially adapted to be formed into thin films for electro-acoustical transducer use. A further advantage of the present invention is a unique predictive capability for the research community to determine whether a given material theoretically will exhibit piezoelectricity in significant amount to justify exhaustive and expensive laboratory evaluation of such material. This advantage of the invention permits the research community to experimentally determine certain physical indicia and the chemical structure of these materials to be evaluated and, based upon these indicia, have confidence in predicting the ability theoretically of the materials to evoke a piezoelectric response. These and other advantages will become readily apparent to those skilled in the art based upon the disclosure contained herein.

DETAILED DESCRIPTION OF THE INVENTION

Polarized polytrifluorovinyl acetate (hereinafter PTFVA) exhibits piezoelectricity at least equivalent to and theoretically better than that reported for prior polymers including PVDF. Several unexpected results and properties of polarized PTFVA have been observed. Present thinking is to the effect that materials polarized (hereinafter often referred to as poled) at higher temperatures, and especially materials that have been oriented, provide markedly better observed piezoelectricity. While such thinking appears to be correct, polarized PTFVA somewhat contradicts such thinking as remarkable piezoelectricity in unoriented films even polarized at room temperature has been observed therefor. Moreover, PTFVA can be synthesized rather readily and cast into films relatively easily, especially when compared to prior confirmed piezoelectric polymers. Note also should be made that polarized PTFVA exhibits pyroelectric behavior responsive even at tempertures of just in excess of room temperature. Such property further demonstrates the unusual properties and sensitivity which polarized PTFVA has.

Besides PTFVA homopolymers, trifluorovinyl acetate copolymers (including interpolymers) can be synthesized readily for formation into piezoelectric and pyroelectric elements which can be thin cast films. Such copolymers provide additional benefits of designing piezoelectric and pyroelectric elements which possess unusually good strength, elasticity, hydrolytic stability, and like film properties. The relative ease with which such copolymer materials can be synthesized, especially on commercial scale, should not be overlooked as a valuable benefit of the invention.

As described above, trifluorovinyl acetate can be polymerized with itself for formation of the corresponding homopolymer or can be polymerized with other vinyl and acrylic monomers for formation of trifluorovinyl acetate copolymers (including interpolymers). Additional suitable ethylenically unsaturated compounds for reaction with trifluorovinyl acetate include, for example, styrene, methyl methacrylate, trifluoroethyl methacrylate, tetrafluoroethylene, vinyl chloride, acrylonitrile, and the like and mixtures thereof. Of course, use of additional compounds or monomers which themselves form piezoelectric homopolymers clearly has advantages. Additional ethylenically unsaturated compounds and method for formation of the homopolymer and copolymers can be found in U.S. Pat. No. 2,436,144 and in *Macromolecular Synthesis*, Vol. 1, p. 59, G. C. Overberger, Editor, Jonn Wiley & Sons, Inc., New York, N.Y. (1963). As noted in these texts, the polymerization proceeds in the presence of conventional free radical addition polymerization catalysts in an oxygen-free atmosphere at moderately elevated temperatures. Such synthesis is known in the art and little more need be said about it here.

The resulting polymers then can be formed into films of desired thickness and surface area for piezoelectric and pyroelectric element formation. The pyroelectric or piezoelectric element consists of the pyroelectric or piezoelectric material disposed between two electrodes. Desirably, such electrodes are disposed on each surface of the thin piezoelectric or pyroelectric polymeric film which electrodes can be used for polarizing the material as well as for later incorporation into an electric circuit for use thereof. Factors which influence the piezoelectric coefficients of the piezoelectric films include orientation of the film, composition and method of fixing the electrode, and polarizing or poling conditions which include: strength of the electric field applied, the time of heating, the rate of heating, the ultimate temperature to which the material is heated, the rate of cooling the material under the applied voltage, and like factors which are well known in the art. The resulting piezoelectric elements are effective under dynamic loading applications and can be used in a variety of energy-transformation applications including as transducers for acoustic receivers for underwater uses, strain gauges, phonograph pick-ups, microphones, speakers, non-contact electric switches, and a wide variety of additional uses. See U.S. Pat. Nos. 3,832,580 and 3,912,830 for further information on polymeric electro-acoustical transducers. Pyroelectric elements have utility in obvious applications of converting heat or thermal energy into an electrical response including TV imaging and a wide variety of conventional uses.

As alluded to previously, a desirable accomplishment yet to be realized by the art is a method for predicting the relative strength of piezoelectric response which various organic polymers will exhibit. Moreover, unifying ceramic and polymeric piezoelectricity additionally is desirable for obvious reasons. A quite unexpected and startling result realized during the course of developing the present invention was a predictive relationship which correlates the chemical structure of materials with physical properties including the piezoelectric response thereof. Moreover, unexpectedly it has been discovered that the critical relationship for piezoelectric response is based upon the refractive index of the material and the ratio of total electro-negative atoms to electro-positive atoms contained in the molecule. The predictive relationship based upon these variables for the $d_{31}$ coefficient of apparently any material (inorganic, organic, and organometallic) is as follows:

$$\log d_{31} = -1.012(n-x') - 11.322, \quad (1)$$

where n is the refractive index of the material and $x'$ is the ratio of total electro-negative (including larger cations) to electro-positive atoms in the molecule.

Note that the $d_{31}$ coefficient is used herein as a yardstick proportional to the piezoelectricity displayed by various materials. It is well known that piezoelectric materials displayed piezoelectric anistropy so that a series of d, g, and other piezoelectric coefficients obtain for the materials. Similar predictive relationships can be developed for the other piezoelectric coefficients of materials according to the precepts of the invention as outlined herein as will be readily apparent to those skilled in the art. For purposes of this application, a material is deemed to have a "suitably high" $d_{31}$ coefficient value if the resulting polarized material possesses a practical or useful piezoelectric response in actual use. Generally, such useful response will be encountered by those materials having a $d_{31}$ coefficient of at least about $1 \times 10^{-12}$ c/n (corresponding to an n-x' value of about 0.67). Note further should be taken that the piezoelectric predictive relationship discovered herein initially is based upon the McGinniss equation as found in "Prediction of Solvent and Polymer Characteristics Through the Use of Easy To Measure Properties," *Organic Coatings and Polymer Chemistry*, Vol. 39, pp. 529–534, preprint of paper presented at the American Chemical Society, Division of Organic Coatings and Plastics Chemistry, Miami Beach, Fla., Sept. 10–15, 1978.

The simplicity of the predictive relationship indeed is unexpected, yet its accuracy is remarkable having a correlation coefficient of 0.96 with a standard error of estimate of 0.35 (See Worthing and Geffner, *Treatment of Experimental Data*, John Wiley & Sons, Inc., New York, N.Y. (1943)) as applied to fourteen known piezoelectric ceramic and organic materials. The following table displays these results.

TABLE 1*

| Piezoelectric Material | Dielectric Constant (E) | Refractive Index (n) | x' | (n − x') | $d_{31}$ ($10^{-12}$ c/n) | $g_{31}$ ($10^{-3}$ vm/N) |
| --- | --- | --- | --- | --- | --- | --- |
| Polyethylene | 2.1 | 1.505 | 0 | 1.505 | 0.035 | 1.88 |
| Polysulfone | 3.3 | 1.633 | 0.181 | 1.452 | 0.350 | 13.2 |
| Nylon 11 | 3.3 | 1.510 | 0.146 | 1.364 | 0.500 | 17.1 |
| Polycarbonate | 2.8 | 1.585 | 0.233 | 1.352 | 0.100 | 3.77 |
| Fluorinated Ethylene Propylene | 2.3 | 1.338 | 0 | 1.338 | 0.035 | 1.72 |
| Polymethyl Methacrylate | 3.2 | 1.490 | 0.470 | 1.020 | 0.430 | 14.30 |
| PVF | 8.5 | 1.460 | 0.704 | 0.756 | 1.300 | 17.30 |
| PAN | 3.6 | 1.514 | 0.959 | 0.555 | 1.500 | 30.80 |
| Quartz | 4.5 | 1.458 | 1.139 | 0.319 | 2.000 | 50.00 |
| PVC | 2.9 | 1.539 | 1.315 | 0.224 | 1.300 | 48.90 |
| PVDF | 10.5 | 1.420 | 1.462 | −0.042 | 20.000 | 174.00 |
| PTFVA | 12.0 | 1.375 | 1.745 | −0.370 | 11.300 | 106.40 |
| ADP | 15.6 | 1.502 | 2.483 | −0.981 | 24.000 | 178.00 |
| BaTiO$_2$ | 1700 | 2.40 | 3.870 | −1.470 | 180.00 | 12.000 |
| Rochell's Salt | 350 | 1.496 | 3.038 | −1.542 | 150.00 | 90.000 |

*$d_{31}$ coefficients for all samples except PTFVA are literature values; dielectric constants and refractive index values are literature values (eg. "The International Plastics Selector 1977", Cordura Publications, Inc., La Jolla, Cal.; and Van Krevelen, "Properties of Polymers", Elsevier Publishing Co., New York, New York, 1972); $g_{31}$ values are calculated; $d_{31}$ coefficient for PTFVA is calculated.

The above-tabulated data shows several interesting features of the invention. Initially, these results show the excellent predicitve power of relationship (1) based on the (n−x') values of the materials. Also, such relationship transcends the organic/inorganic distinction between these materials. Relationship (1) provides predictability of the theoretical maximum piezoelectricity which a material can display, assuming optimum polarizing conditions, electrode fixation, etc. Note that orientation inherently is associated for by the refractive index indication.

Further, materials with large negative (n−x') values possess improved piezoelectricity as measured by $d_{31}$ coefficients. It will be readily apparent that large negative (n−x') values also exist for organo-metallic materials having large metal-to-carbon atomic weight ratios [eg. note Rochell's salt, KNa (C$_4$H$_4$O$_6$)]. It is believed that PVDF and especially PTFVA are at about the upper end of organic piezoelectric elements according to relationship (1). Likely organo-metallic materials which can be formed into flexible, durable thin films will provide expected good piezoelectric acoustic transducers.

Again referring to PTFVA homopolymers and copolymers, such materials also are expected to be excellent mediums for phosphors of electroluminescent devices because of the relatively high dielectric constants of such materials. Expected advantages are for electroluminescent devices designed for maximum power (optical brightness) output at the expense of device longevity. Further information on electroluminescent devices can be found in U.S. Pat. Nos. 2,838,715 and 3,769,977.

The following examples show how the present invention can be practical, but should not be construed as limiting. In this application, all units are in the metric system unless otherwise expressly indicated and all references are incorporated herein by reference.

EXAMPLES

EXAMPLE 1

Synthesis of Polytrifluorovinyl acetate (PTFVA)

PTFVA was prepared according to the procedure outlined in *Macromolecular Synthesis*, Vol. 1, p. 59, C. G. Overberger, editor, John Wiley and Sons, Inc., New York, N.Y. (1963) and U.S. Pat. No. 2,436,144. In this procedure 50 g of trifluorovinyl acetate monomer (supplied by PCR Industries, Gainesville, Fla.) was distilled (b.p. of 38° C.) into a glass ampule containing 0.144 g of a free radical initiator (Vazo 52 catalyst, E. I. DuPont de Nemours and Company, Wilmington, Del.). The ampule was frozen at dry ice conditions, sealed under vacuum, and placed in a constant temperature water bath at 40° C. for 24 hours of reaction time.

The resulting homopolymer was dissolved in dry acetone, precipitated with dry petroleum ether at 30°-60° C., redried, and then stored in a vacuum dessicator for 24 hours before use in preparing a film therefrom.

Film Preparation

Films of PTFVA were cast by redissolving the homopolymer in dry acetone and casting the resulting solution on polyester (Mylar brand) film supports. After ten minutes the films were stripped from the Mylar support and placed in a vacuum oven to evaporate final traces of occluded solvent. Film thicknesses ranged from about 1-6 mils.

Film Orientation

Cast films of PTFVA were oriented in an instron testing apparatus according to normal procedures for uniaxial drawing as outlined by K. Desper, W. G. Zionetta, and R. W. Lewis in "Radiant Oven Stretching Process for Thin Film Polymeric Armor Material," Technical Report AMMRC TN 74-11, Army Materials and Mechanics Research Center, Watertown, Ma. (September 1974). For the 3:1 drawing ratio the speed was 1.27 cm/min at 76° C. with a heat treatment of 45 minutes at 76° C. The 4:1 drawing ratio oriented films were oriented under the same conditions.

Electrode Fixation

Aluminum or other metals (eg. gold, silver, nickel, etc.) were evaporated onto the surfaces of the film samples (oriented and unoriented) by vacuum metalizing techniques similar to those described in RADC-TR-186, Vol. 1 (Final technical report), September 1976—AD-AO32315. In these techniques the film is held between stainless steel or plastic masks that allowed preparation of five (5) circular (2.2 cm diameter) samples from a 7.62 cm square sheet of the film sample. The aluminum electrode film thickness was controlled to be about 1,000 A, consistent with known technology for producing electrically conductive electrodes without effecting a major influence on the film modulus. This type of electrode configuration is designed to allow measurement of the $g_{33}$ coefficient of the film sample.

Polarizing Conditions

The aluminum electrode fixed film was placed between two additional metal electrodes (aluminum) of approximately the same shape and size as the fixed aluminum electrodes but with extended arms for electrical connection. This configuration then was placed between polyimide film electrical insulation and overlaid with glass plates for further insulation and surface uniformity or flatness. The entire system was placed into a laboratory press to apply a contact pressure and a source of thermal energy.

External electrical connections were applied to the extended metal electrodes, the temperature raised to the desired value, and a D.C. voltage applied over a specified time interval. Thereafter, the samples were cooled to room temperature at the applied voltage. Additional information regarding techniques of poling can be found in "Proceedings of Piezoelectric and Pyroelectric Symposium—Workshop," NBS, Washington, D.C., September 1975, M. G. Broadhurst, Editor, NTIS-AD/A-016 843.

Piezoelectric Evaluation

Two accepted techniques for evaluating piezoelectric polymers are a comparator technique and a microphone calibrator technique. In the comparator technique, a pulse generator initiates successive ultrasonic pulses of constant amplitude from a transducer. The ultrasonic pulses travel through an aluminum delay line and impinge on the test specimen at normal incidence. The specimen is coupled to the face of the delay line by a suitable coupling device. The incident pulses produce a voltage across the specimen if it is piezoelectric. This voltage is compared to the voltage produced when the same amplitude pulses impinge on a known standard (quartz). The specimen and the standard are thin compared with the wavelength of the impinging pulses.

Measurements are made initially on the unknown specimen. The specimen then is removed and replaced by the standard. If the signal from the standard is higher than that of the specimen, attenuation is applied until the received signal from the quartz standard equals that of the unknown. The number of decibels is read as a negative quantity. If the quartz signal is less than that of the specimen, the decibel insertion to bring the specimen to an amplitude equal to the quartz reference is read as a positive quantity. The decibel readings are designated as $N_{db}$ in the equation:

$$\log_{10} g_{33} = \frac{N_{db}}{20} + \log_{10} g_{ref},$$

where for the quartz reference (X-cut) log $_{10}g_{ref}$ is $-1.136572$.

Pyroelectric Evaluation

Pyroelectric responses of unknown specimens were determined from procedures similar to the procedures outlined in *Electrets*, G. M. Sessler, Editor, Springer-/Verlag, New York, N.Y. (1980). A sample of the polarized film with electrodes (Al) fixed was placed in a closed circuit by series connection with a resistor to an operational amplifier which had a variable gain control. The output of the circuit was connected to an electrometer. The specimen was placed in an oven which had a variable temperature control for heating at either 5° C. or 10° C. per minute. The current output of the specimen at time and temperature intervals was recorded.

EXAMPLE 2

The poling conditions, film orientation, and $g_{33}$ piezoelectric coefficients of PTFVA films were as follows:

| | POLING CONDITIONS | | | | | |
|---|---|---|---|---|---|---|
| Sample No. | Orientation Draw Ratio (L/L) | Temp. (°C.) | Voltage (kv/cm) | Time (hrs) | $g_{33}$ $(10^{-3}$ VM/N) | $d_{33}$* $(10^{-12}$ C/N) |
| 1 | 0 | 25 | 200 | 1 | 3.6 | .382 |
| 2 | 0 | 25 | 560 | 1 | 5.8 | .616 |
| 3 | 3:1 | 25 | 300 | 1 | 1.2 | .127 |
| 4 | 3:1 | 60 | 275 | 1 | 16.4 | 1.742 |

*calculated, $d_{33} = g_{33} K \epsilon°$, where K is the dielectric constant, 12, and $\epsilon°$ is the permittivity of free space, $8.85 \times 10^{-12}$ f/M.

The above-tabulated results demonstrate several unexpected properties of polarized PTFVA films. Initially, the polarized PTFA film displayed a $g_{33}$ coefficient for an unoriented film which was polarized at room temperature. Since orientation and high poling temperatures are taught by the art to enhance piezoelectric responses of materials, these results are remarkable. For example, PAN (polyacrylonitrile) oriented at 2:1, 3:1, and 5:1 and polarized at 25° C., 246 kv/cm for one hour demonstrated no $g_{33}$ coefficient, yet is a known piezoelectric material when polarized at higher temperature. The influence of poling temperature is evident for the PTFVA film also.

EXAMPLE 3

A 3:1 oriented PTFVA sample polarized at 95° C. for 15 minutes at 100 v/mil was subjected to pyroelectric evaluation with the oven set for a temperature rise time of 10° C./min. The current output versus time and temperature are given below.

| Time (sec) | Temperature (°C.) | Current Output $(10^{-9}$ amp) |
|---|---|---|
| 132 | 43 | 2.8 |
| 192 | 52 | 5.0 |
| 252 | 62 | 9.5 |
| 312 | 70 | 18.0 |
| 372 | 80 | 50.0 |
| 432 | 84 | 140.0 |
| 492 | 100 | 250.0 |
| 552 | 106 | 280.0 |
| 612 | 115 | 360.0 |
| 672 | 120 | 370.0 |
| 732 | 125 | 250.0 |

Based upon the foregoing results, the apparent polarization, $P_s$, can be calculated according to the equation, $$P_s = \frac{Q}{A} = \int I dt / A$$

where Q is the charge in coulombs and
A is the area of the pyroelectric element. The apparent polarization or charge density for this sample was calculated to be 32.71 $\mu$C./cm$^2$

EXAMPLE 4

Another sample of a 3:1 oriented PTFVA film was poled at 100° C. for 15 minutes at 250 v/mil and subjected to pyroelectric evaluation with the oven set for a temperature rise time of 5° C./min. The following results were recorded.

| Time (sec) | Temperature (°C.) | Current Output ($10^{-9}$ amp) |
| --- | --- | --- |
| 6 | 29 | 0.5 |
| 66 | 31 | 0.55 |
| 126 | 34 | 0.65 |
| 186 | 38 | 1.0 |
| 246 | 42 | 1.4 |
| 306 | 46 | 2.0 |
| 366 | 50 | 3.0 |
| 426 | 55 | 4.5 |
| 486 | 60 | 7.0 |
| 546 | 64 | 10.0 |
| 606 | 69 | 17.0 |
| 666 | 75 | 30.0 |
| 726 | 80 | 47.0 |
| 786 | 84 | 72.0 |
| 846 | 88 | 90.0 |
| 906 | 93 | 120.0 |
| 966 | 98 | 140.0 |
| 1026 | 102 | 190.0 |
| 1086 | 107 | 240.0 |
| 1146 | 112 | 250.0 |

The apparent polarization, $P_s$, for this sample was calculated to be 37.7 $\mu$C./cm$^2$. A current response at room temperature was recorded.

EXAMPLE 5

Synthesis of Trifluorovinyl Acetate Copolymers

Copolymers of trifluorovinyl acetate (TFVA) and styrene (STY), methyl methacrylate (MMA), and trifluoroethyl methacrylate (TFEMA) were prepared as follows. Into three different glass ampules was placed 10 g MMA, 5 g STY, and 5 g TFEMA, respectively. Each glass ampule contained 0.2 g of a free radical initiator (Vazo 52 catalyst, E. I. DuPont de Nemours and Company, Wilmington, Del.). Into each ampule was distilled TFVA in the following proportions: 90 g, 95 g, and 95 g, respectively. The ampules were frozen at dry ice conditions, sealed under vacuum, and then placed in a 40° C. constant temperature water bath for 60 hours. The resultant copolymers were virtually 100% solids material and had the following approximate composition ratio:

Sample 5: PTFVA/PMMA=90/10
Sample 6: PTFVA/PSTY=95/5
Sample 7: PTFVA/PTFEMA=95/5.

Film preparation, film orientation (if any), electrode fixation, polarizing conditions, piezoelectric evaluation, and pyroelectric evaluation on these PTFVA copolymers were conducted in substantially the same manner as they were conducted for the PTFVA homopolymers.

EXAMPLE 6

The poling conditions, film orientation, and $g_{33}$ piezoelectric coefficients of the PTFVA copolymer films were as follows:

POLING CONDITIONS

| Sample No. | Orientation | Temp. (°C.) | Voltage (V/cm) | Time (hrs.) | $g_{33}$ ($10^{-3}$ vm/n) | $d_{33}$* ($10^{-12}$ C/N) |
| --- | --- | --- | --- | --- | --- | --- |
| 5 | 0 | 60 | 200 | 1 | 1.5 | 0.159 |
| 6 | 0 | 60 | 200 | 1 | 1.0 | 0.106 |
| 7 | 0 | 60 | 200 | 1 | 2.0 | 0.212 |

*calculated as in Example 2.

EXAMPLE 7

The PTFVA copolymer samples subjected to pyroelectric evaluation were poled at 150 v/mil for 15 minutes at 100° C. (no orientation). The maximum pyroelectric generated current output was recorded at the following temperatures:

Sample 5: $1 \times 10^{-7}$ amp at 115° C.
Sample 6: $2 \times 10^{-7}$ amp at 120° C.
Sample 7: $3.5 \times 10^{-7}$ amp at 120° C.

We claim:

1. A pyroelectric element comprising a polarized copolymer or homopolymer of trifluorovinyl acetate disposed between two electrodes.

2. The element of claim 1 wherein said polarized trifluorovinyl acetate is in homopolymer form.

3. The element of claim 1 wherein said polarized trifluorovinyl acetate is in copolymer form.

4. The element of claim 3 wherein said copolymer is of trifluorovinyl acetate and an ethylenically unsaturated compound.

5. The element of claim 4 wherein said ethylenically unsaturated compound is selected from the group consisting of styrene, methyl methacrylate, trifluoroethyl methacrylate, tetrafluoroethylene, vinyl chloride, acrylonitrile, and combinations thereof.

6. The element of claim 1 wherein said polarized copolymer or homopolymer of trifluorovinyl acetate is a thin film thereof having an electrode disposed on both surfaces thereof.

7. A method for converting thermal energy into electrical energy through a pyroelectric transducer which comprises converting said energies through a pyroelectric element comprising a polarized copolymer or homopolymer of trifluorovinyl acetate interposed between two electrodes.

8. The method of claim 7 wherein said thin film is of polarized polytrifluorovinyl acetate homopolymer.

9. The method of claim 7 wherein said thin film is of polarized copolymer of trifluorovinyl acetate.

10. The method of claim 9 wherein said copolymer is of trifluorovinyl acetate and an ethylenically unsaturated compound.

11. The method of claim 10 wherein said ethylenically unsaturated compound is selected from the group consisting of styrene, methyl methacrylate, trifluoroethyl methacrylate, tetrafluoroethylene, vinyl chloride, acrylonitrile, and combinations thereof.

* * * * *